United States Patent
Yu et al.

(10) Patent No.: US 12,410,950 B2
(45) Date of Patent: Sep. 9, 2025

(54) NANO THERMAL DIODE BASED ON POLARIZATION CONTROL OF NANOPARTICLES ON GRAPHENE NANOGRATING

(71) Applicant: Toyota Motor Engineering & Manufacturing North America, Inc., Plano, TX (US)

(72) Inventors: Ziqi Yu, Ann Arbor, MI (US); Xiaopeng Li, Ann Arbor, MI (US); Taehwa Lee, Ann Arbor, MI (US)

(73) Assignees: TOYOTA MOTOR ENGINEERING & MANUFACTURING NORTH AMERICA, INC., Plano, TX (US); TOYOTA JIDOSHA KABUSHIKI KAISHA, Toyota (JP)

( * ) Notice: Subject to any disclaimer, the term of this patent is extended or adjusted under 35 U.S.C. 154(b) by 446 days.

(21) Appl. No.: 18/148,094

(22) Filed: Dec. 29, 2022

(65) Prior Publication Data

US 2024/0219078 A1     Jul. 4, 2024

(51) Int. Cl.
*H10N 15/00* (2023.01)
*F25B 21/00* (2006.01)

(52) U.S. Cl.
CPC ............ *F25B 21/00* (2013.01); *H10N 15/00* (2023.02)

(58) Field of Classification Search
None
See application file for complete search history.

(56) References Cited

U.S. PATENT DOCUMENTS

| | | | | |
|---|---|---|---|---|
| 2014/0352682 | A1* | 12/2014 | Sheehan | F24V 30/00 126/263.01 |
| 2020/0028060 | A1* | 1/2020 | Heremans | H10N 15/00 |
| 2020/0212282 | A1* | 7/2020 | Nakatsuji | H10N 15/00 |
| 2022/0336724 | A1* | 10/2022 | Noda | H02N 11/00 |

FOREIGN PATENT DOCUMENTS

CN    114877741 A    8/2022

OTHER PUBLICATIONS

Yu, Ziqi, et al., "Near-field radiative heat trasfer in three-body Weyl semimetals", Optics Express research article, vol. 30, No. 18, Aug. 29, 2022, 18 pages.

* cited by examiner

*Primary Examiner* — Benjamin P Sandvik
(74) *Attorney, Agent, or Firm* — Jordan IP Law, LLC

(57) ABSTRACT

A thermal diode includes: a dielectric enclosure having a top surface, a bottom surface, a first side, and a second side; a first Weyl semimetal nanoparticle disposed on the first side; a second Weyl semimetal nanoparticle disposed on the second side; a nanograting disposed on the bottom surface; and a voltage source configured to provide a voltage bias to the nanograting to suppress surface waves from the first Weyl semimetal nanoparticle to the second Weyl semimetal nanoparticle and to modify surface waves from the second Weyl semimetal nanoparticle to the first Weyl semimetal nanoparticle.

20 Claims, 14 Drawing Sheets a a

NANO THERMAL DIODE BASED ON POLARIZATION CONTROL OF NANOPARTICLES ON GRAPHENE NANOGRATING

TECHNICAL FIELD

One or more embodiments relate generally to thermal diodes.

BACKGROUND

A Weyl semimetal (WS) is a solid state crystal, whose low energy excitations are Weyl fermions that carry electrical charge even at room temperatures.

FIG. 1A illustrates a related art thermal diode using InSb in one mode of operation.

As shown in the figure, a InSb particle 104 and an InSb particle 106 are suspended above a bulk InSb substrate 102. In this example, InSb particle 104 is heated to a much higher temperature than that of InSb particle 106. As a result, InSb particle 104 will transfer heat to InSb particle 106 as shown by arrow 110. This net heat transfer is termed heat flux, $Q_{12}$, which is the difference between the heat emitted by particle 104 and the heat received by particle 104 due to the thermal emission by particle 106 and wherein the "heat" is in the form of near field thermal radiation and the flux is in a direction as indicated by arrow 110.

FIG. 1B illustrates the related art thermal diode of FIG. 1A in a second mode of operation, wherein InSb particle 106 is heated to a much higher temperature than that of InSb particle 104. As a result, InSb particle 106 will transfer heat to InSb particle 104 as shown by arrow 112. This net heat transfer is termed heat flux, $Q_{21}$, which is the difference between the heat emitted by particle 106 and the heat received by particle 106 due to the thermal emission by particle 104 and wherein the "heat" is in the form of near field thermal radiation and the flux is in a direction as indicated by arrow 112.

In the systems of FIGS. 1A-B, a strong magnetic field 108 is provided, wherein magnetic field 108 is a direction into the figure, and is on the order of 2 T.

In operation, by applying magnetic field 108, the electromagnetic waves propagating at the surface of substrate 102 becomes nonreciprocal, where at certain frequencies the waves traveling in one direction at the surface is supported whereas that in the opposite direction is suppressed.

It should be noted that atoms at the surface of substrate 102 may still act similarly with respect to electromagnetic waves propagating in one direction verses another direction. However, the microscopic structure inside substrate 102 may be different when a magnetic field is applied. In particular, in the presence of a magnetic field, off-diagonal components appear in the permittivity tensor and the electromagnetic wave transport becomes asymmetric at the surface of substrate 102. Mathematically, it may be described as the solution to the wave function at the surface of substrate 102 has solutions in one direction, while in the other direction there is no solution.

Thus, the net heat fluxes in two operation modes, i.e., $Q_{12}$ as shown in FIG. 1A and $Q_{21}$ as shown in FIG. 1B, will be different. In other words, heat flows more in one direction as compared to the other direction, which enables the thermal rectification.

However, the system discussed in FIGS. 1A-B requires strong magnetic fields to realize a large rectification ratio. When the magnetic field is 2 T, the maximum rectification ratio reaches approximately 6. This will be described in greater detail with reference to FIG. 2.

FIG. 2 illustrates a rectification graph 200 of the related art thermal diode of FIGS. 1A-B. As shown in FIG. 2, graph 200 includes a y-axis 202, an x-axis 204, and a function 206.

Y-axis 202 corresponds to a rectification ratio, $\eta$, defined as follows:

$$\eta = (Q_{12} - Q_{21})/Q_{12} \qquad (1)$$

X-axis 204 corresponds to the distance between InSb particle 104 and InSb particle 106, measured in μm.

The maximum rectification is noted at point 208 of function 206, whereas dotted line 210 represents an asymptotic limit of the rectification, which is equal to 1 and indicates that no rectification occurs.

In addition to the large magnetic field needed, another problem with the system discussed above with reference to FIGS. 1A-B is that suspending InSb particle 104 and InSb particle 106 above substrate 102 is practically challenging. Moreover, to tune the rectification ratio, the distance between InSb particle 104 and InSb particle 106 needs to be changed, which again would be difficult to achieve in reality.

What is needed is a thermal diode that may achieve improved rectification over that of the system discussed above with reference to FIGS. 1A-2, without the need for suspending particles over a substrate and without the need of such a large magnetic field.

SUMMARY

An aspect of the present disclosure is drawn to a thermal diode including: a dielectric enclosure having a top surface, a bottom surface, a first side, and a second side; a first Weyl semimetal nanoparticle disposed on the first side; a second Weyl semimetal nanoparticle disposed on the second side; a nanograting disposed on the bottom surface; and a voltage source configured to provide a voltage bias to the nanograting to suppress surface waves from the first Weyl semimetal nanoparticle to the second Weyl semimetal nanoparticle and to modify surface waves from the second Weyl semimetal nanoparticle to the first Weyl semimetal nanoparticle.

In some embodiments of this aspect, the first Weyl semimetal nanoparticle and the second Weyl semimetal nanoparticle comprise a material selected from the group of materials consisting of $Co_3Sn_2S_2$, $Mn_3Sn$, $EuCd_2As_2$, TaAs, $MoTe_2$, NbAs, $YbMnBi_2$, and $WTe_2$.

In some embodiments of this aspect, the dielectric enclosure includes $SiO_2$.

In some embodiments of this aspect, the distance between the nanograting and the first Weyl semimetal nanoparticle is 80 nm.

In some embodiments of this aspect, the nanograting includes graphene.

Another aspect of the present disclosure is drawn to a method of making a thermal diode, the method including: providing a nanograting; forming a first portion of a dielectric on top of the provided nanograting; depositing a first Weyl semimetal nanoparticle at a first location on top of the first portion of the dielectric; depositing a second Weyl semimetal nanoparticle at a second location on top of the first portion of the dielectric; forming a second portion of the dielectric on top of the first portion of the dielectric, the first Weyl semimetal nanoparticle, and the second Weyl semimetal nanoparticle; and connecting a voltage source to the nanograting, wherein the voltage source is configured to provide a voltage bias to the nanograting to suppress surface waves from the first Weyl semimetal nanoparticle to the second Weyl semimetal nanoparticle and to modify surface waves from the second Weyl semimetal nanoparticle to the first Weyl semimetal nanoparticle In some embodiments of this aspect, the depositing of the first Weyl semimetal nanoparticle at the first location on top of the first portion of the dielectric includes depositing the first Weyl semimetal nanoparticle including a material selected from the group of materials consisting of $Co_3Sn_2S_2$, $Mn_3Sn$, $EuCd_2As_2$, TaAs, $MoTe_2$, NbAs, $YbMnBi_2$, and $WTe_2$.

In some embodiments of this aspect, the forming of the first portion of the dielectric on top of the provided nanograting includes forming the first portion of the dielectric including $SiO_2$.

In some embodiments of this aspect, the depositing of the second Weyl semimetal nanoparticle at the second location on top of the first portion of the dielectric includes depositing the second Weyl semimetal nanoparticle from the first Weyl semimetal nanoparticle of 1 µm.

In some embodiments of this aspect, the providing of the nanograting includes providing a graphene nanograting.

Another aspect of the present disclosure is drawn to a method including: providing a thermal diode including: a dielectric enclosure having a top surface, a bottom surface, a first side, and a second side; a first Weyl semimetal nanoparticle disposed on the first side; a second Weyl semimetal nanoparticle disposed on the second side; a nanograting disposed on the bottom surface; and a voltage source configured to provide a voltage bias to the nanograting to suppress surface waves from the first Weyl semimetal nanoparticle to the second Weyl semimetal nanoparticle and to modify surface waves from the second Weyl semimetal nanoparticle to the first Weyl semimetal nanoparticle; applying the voltage bias to the nanograting; and rotating the first Weyl semimetal nanoparticle and the second Weyl semimetal nanoparticle about an axis by an angle $\Theta$, wherein $0° \leq \Theta \leq 360°$.

In some embodiments of this aspect, the providing of the thermal diode includes providing the thermal diode such that the first Weyl semimetal nanoparticle and the second Weyl semimetal nanoparticle comprise a material selected from the group of materials consisting of $Co_3Sn_2S_2$, $Mn_3Sn$, $EuCd_2As_2$, TaAs, $MoTe_2$, NbAs, $YbMnBi_2$, and $WTe_2$.

In some embodiments of this aspect, the providing of the thermal diode includes providing the thermal diode such that the dielectric enclosure includes $SiO_2$.

In some embodiments of this aspect, the providing of the thermal diode includes providing the thermal diode such that the distance between the nanograting and the first Weyl semimetal nanoparticle is 80 nm.

In some embodiments of this aspect, the providing of the thermal diode includes providing the thermal diode such that the nanograting includes graphene.

In some embodiments of this aspect, the method further includes applying, via the voltage source, a second voltage bias to the nanograting; and rotating the second Weyl semimetal nanoparticle about the axis by a second angle $\Theta_2$, wherein the voltage source is additionally configured to provide the second voltage bias to the nanograting to suppress surface waves from the second Weyl semimetal nanoparticle to the first Weyl semimetal nanoparticle and to modify surface waves from the first Weyl semimetal nanoparticle to the second Weyl semimetal nanoparticle, wherein a first net heat flux is different from a second net heat flux, wherein the first net heat flux corresponds to a difference between a first heat flux from the first Weyl semimetal nanoparticle to the second Weyl semimetal nanoparticle and a second heat flux from the second Weyl semimetal nanoparticle to the first Weyl semimetal nanoparticle when the second Weyl semimetal nanoparticle is rotated about the axis by the angle $\Theta$, wherein the second net heat flux corresponds to a difference between a third heat flux from the first Weyl semimetal nanoparticle to the second Weyl semimetal nanoparticle and a fourth heat flux from the second Weyl semimetal nanoparticle to the first Weyl semimetal nanoparticle when the second Weyl semimetal nanoparticle is rotated about the axis by the angle $\Theta_2$, wherein $0° \leq \Theta_2 \leq 360°$, and wherein $\Theta \neq \Theta_2$.

In some embodiments of this aspect, the rotating of the second Weyl semimetal nanoparticle about the axis by the angle $\Theta$, includes applying a magnetic field to the second Weyl semimetal nanoparticle. In some of these embodiments, the applying of the magnetic field to the second Weyl semimetal nanoparticle includes applying the magnetic field to the second Weyl semimetal nanoparticle for a predetermined time period. In some of these embodiments, the applying of the magnetic field to the second Weyl semimetal nanoparticle includes applying the magnetic field at a predetermined field strength to the second Weyl semimetal nanoparticle.

BRIEF SUMMARY OF THE DRAWINGS

The accompanying drawings, which are incorporated in and form a part of the specification, illustrate and explain example embodiments. In the drawings.

DETAILED DESCRIPTION

Figure 1A:
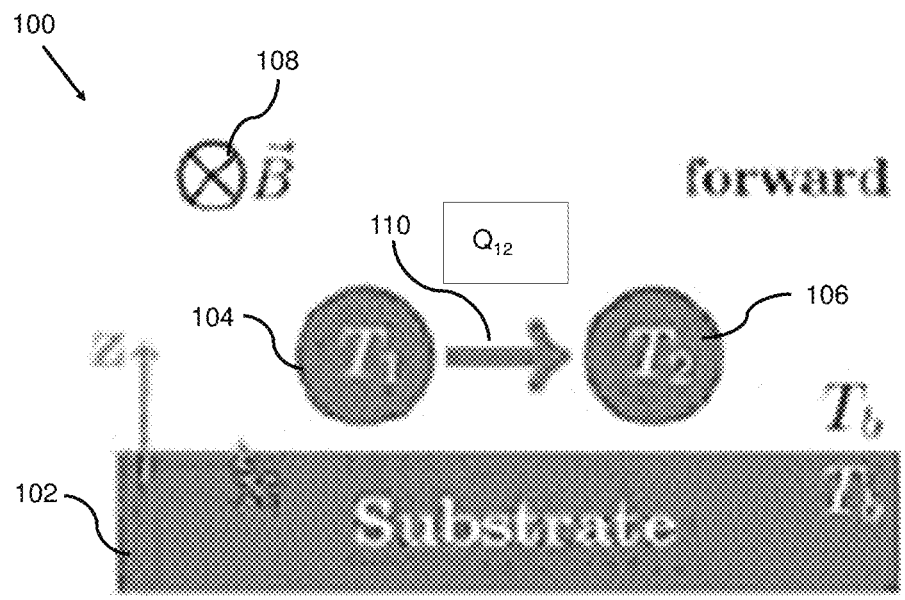
FIG. 1A illustrates a related art thermal diode in one mode of operation.
Figure 1B:
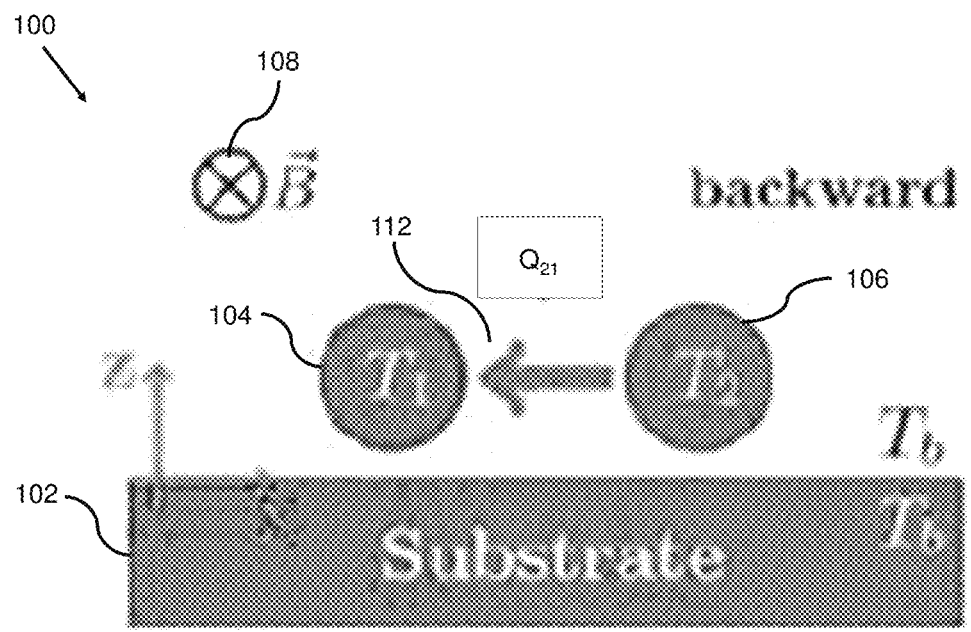
FIG. 1B illustrates the related art thermal diode of FIG. 1A in a second mode of operation.
Figure 2:
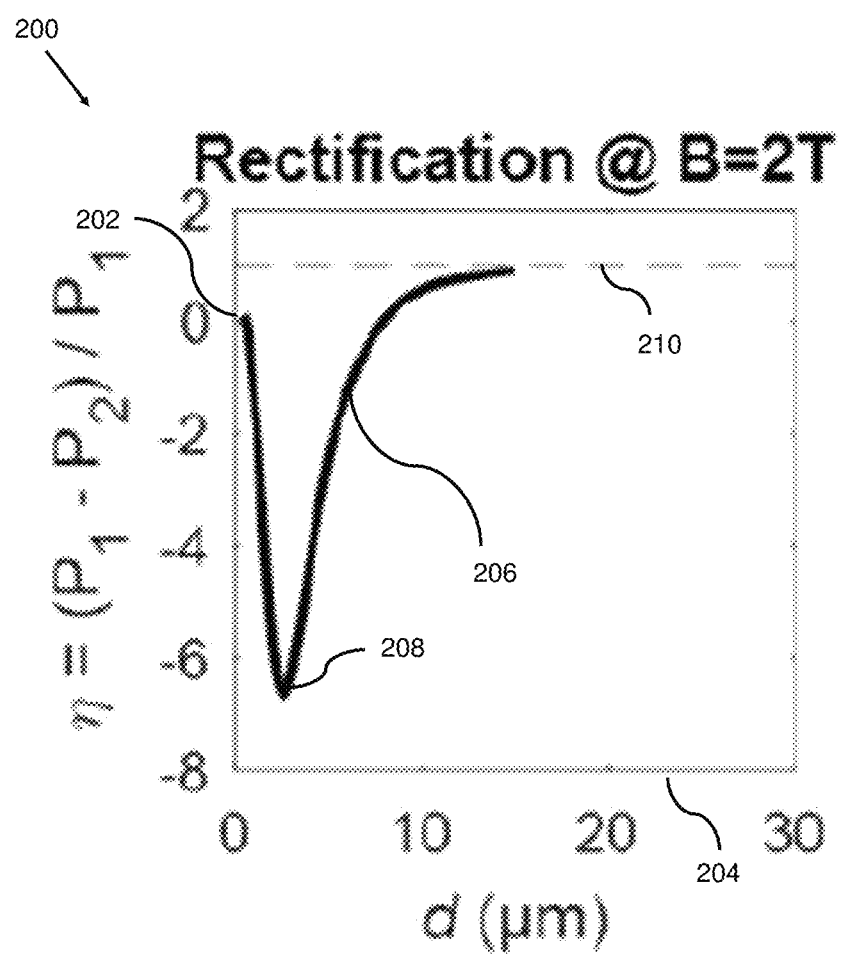
FIG. 2 illustrates a rectification graph of the related art thermal diode of FIGS. 1A-B.

A thermal diode in accordance with aspects of the present disclosure achieves improved rectification over that of the system discussed above with reference to FIGS. 1A-2, without the need for suspending nanoparticles over a substrate and without the need of applying a large external magnetic field.

A nanoscale thermal diode that includes Weyl semimetal nanoparticles and a graphene nanograting in accordance with aspects of the present disclosure achieves a thermal rectification ratio ranging from $10^{-2}$ to $2\times10^3$ by actively controlling the nonreciprocal surface waves in graphene nanograting, the polarization and the material property of the Weyl semimetal nanoparticles.

In accordance with aspects of the present disclosure, WS particles are embedded in a dielectric enclosure to position them at desired distance above a graphene nanograting. The graphene nanograting provides much stronger nonreciprocal response when a bias voltage is applied. A tunable thermal rectification can be realized by changing the polarization of the WS particles, such as exciting the dipole response of the particles with differently polarized electromagnetic waves, which does not require changing the geometry of either particles or graphene nanograting. The thermal rectification characteristic can be additionally tuned by changing the loss factor of the WS, which can be practically implemented by introducing appropriate dopants or properly choosing the WS materials.

An example thermal diode, method of making and method of operating the same in accordance with aspects of the present disclosure will now be described in greater detail with reference to FIGS. 3-11D.

Figure 3:
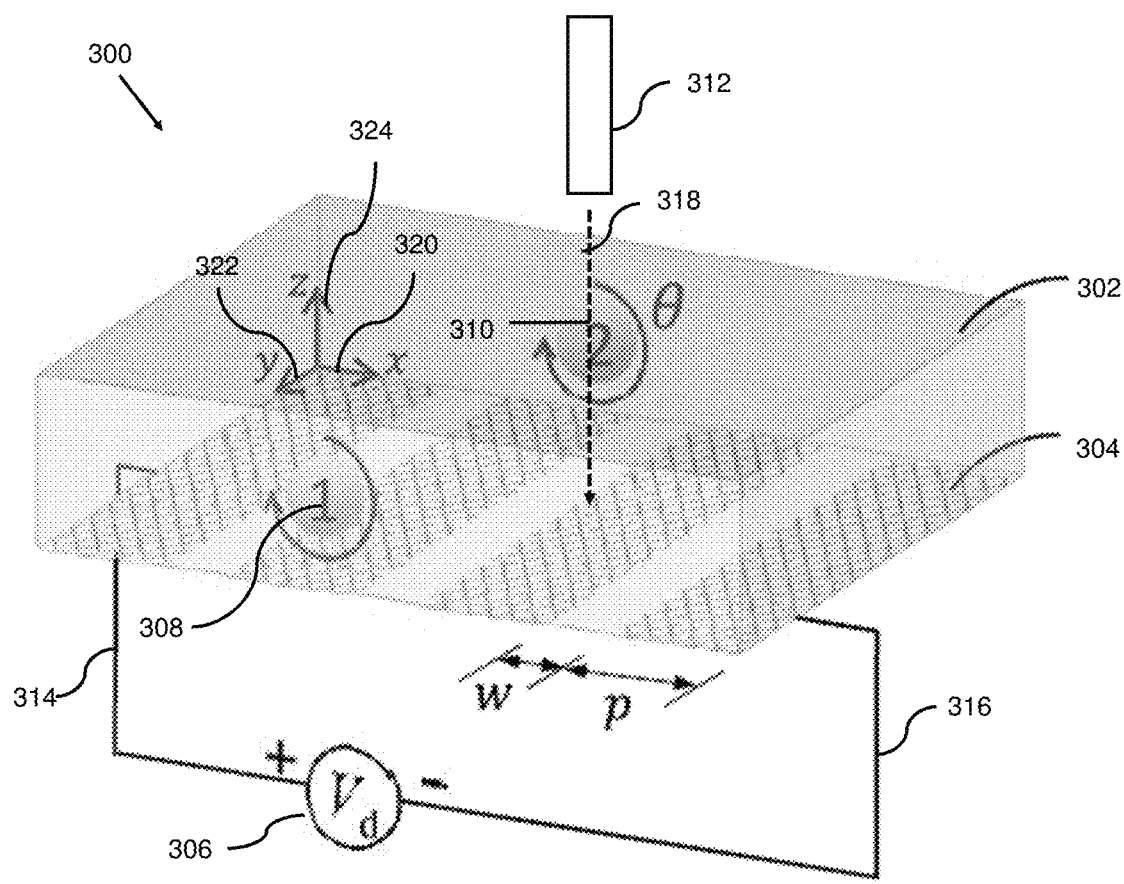
FIG. 3 illustrates a thermal diode system in accordance with aspects of the present disclosure.

FIG. 3 illustrates a thermal diode system 300 in accordance with aspects of the present disclosure.

As shown in the figure, thermal diode system 300 includes a dielectric enclosure 302, a nanograting 304, a voltage source 306, a WS nanoparticle (WSN) 308, a WSN 310, a magnetic field source 312, a conducting line 314, and a conducting line 316.

Dielectric enclosure 302 may include any commonly used dielectric materials, a non-limiting example of which includes $SiO_2$. Dopant may include Boron and Phosphorous, or any known p or n type dopants. The amount of doping, for example on the order of $10^{15}$~$10^{19}$ cm$^{-3}$, as will be described in greater detail below, affects the amount of thermal rectification.

Magnetic field source 312 is configured to provide a magnetic field in a direction indicated by line 318 to affect WS particle 310, as will be described in more detail below. Magnetic field source 312 may be any known magnetic field source, non-limiting examples of which include permanent magnets and electromagnets.

An x-axis 320, a y-axis 322, and a z-axis 324 are shown for reference.

WSN 308 and WSN 310 are embedded within dielectric enclosure 302. WSN 308 is separated from WSN 310 by a predetermined distance along y-axis 322. In a non-limiting example embodiment, WSN 308 is separated from WSN 310 by 1 μm.

WSN 308 and WSN 310 may be any known WS, non-limiting examples of which include $Co_3Sn_2S_2$, $Mn_3Sn$, $EuCd_2As_2$, TaAs, $MoTe_2$, NbAs, $YbMnBi_2$, and $WTe_2$. In an example embodiment, each of WSN 308 and WSN 310 may have a radius in the range of 5-30 nm.

In an example embodiment, nanograting 304 is selected from the group of graphene and borophene. In an example embodiment, the distance from nanograting 304 to each of WSN 308 and WSN 310 in a direction of z-axis 324 is within a range of 80-250 nm. Nanograting 304 has a periodicity of p+w, wherein in a non-limiting example embodiment p+w=10 nm and a width of p=5 nm.

A dipolar response of a WSN can be externally excited by an electromagnetic wave with a preferred polarization. Such polarization may be defined by an angle in the xz-plane about the y-axis. The polarization-dependent excitation is equivalent to implementing a rotation of the nanoparticles around the y-axis by an angle Θ. When voltage source 306 provides a bias voltage $V_d$ by way of conducting line 314 to nanograting 304, the electromagnetic waves propagating along the y-axis will exhibit strong direction preference.

For example, the surface wave from WSN 308 to WSN 310 may be suppressed, while the opposite wave may be modified to be enhanced. Such directional preference will enable selectively propagating heat energy between WSN 308 and WSN 310, which realizes the thermal diode.

In other words, a voltage bias $V_d$ applied to nanograting 304 creates an electric field within dielectric enclosure 302, which affects surface waves within dielectric enclosure 302. The magnetic field from magnetic field source 312 rotates WSN 310. In some embodiments, the rotation of WSN 310 may be accomplished when turning on the magnetic field to apply a magnetic force. Once the rotation is completed, the magnetic field may be turned off. The effect of the rotating of WSN 310 and the surface waves is such that, near field thermal radiation as transmitted from WSN 308 to WSN 310, when WSN 308 is of a higher temperature as that of WSN 310, is different from the near field thermal radiation as transmitted from WSN 310 to WSN 308, when WSN 310 is of a higher temperature as that of WSN 308. This difference in the directional flow of the near field thermal radiation defines the thermal diode.

Figure 4:
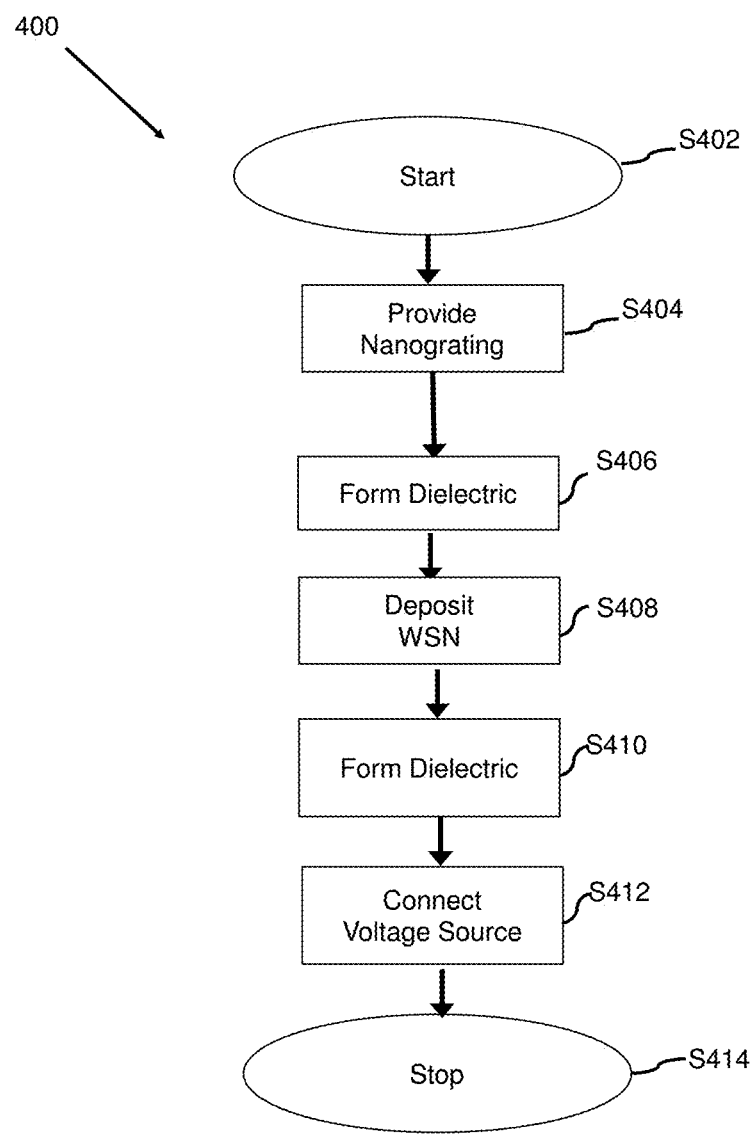
FIG. 4 illustrates an example method of making a thermal diode in accordance with aspects of the present disclosure.

FIG. 4 illustrates an example method 400 of making a thermal diode in accordance with aspects of the present disclosure. As shown in the figure, method 400 starts (S402) and a nanograting is provided (S404). This will be described in greater detail with reference to FIGS. 5A-C.

FIG. 5A-H illustrate eight processes, respectively, for making a thermal diode in accordance with aspects of the present disclosure.

Figure 5A:
FIG. 5A-H illustrate eight processes, respectively, for making a thermal diode in accordance with aspects of the present disclosure.

As shown in FIG. 5A, a layer 502 of graphene is formed. This may be performed by any known method, a non-limiting example of which includes chemical vapor deposition.

Figure 5B:
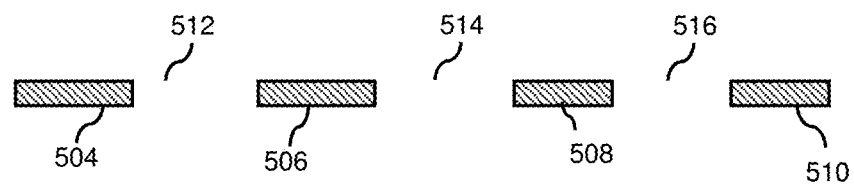

As shown in FIG. 5B, layer 502 of graphene is etched to create a grating. This may be performed by any known method, a non-limiting example of which includes etching via mask. In this example, layer 502 of graphene is etched to provide graphene portions 504, 506, 508 and 510, separated by spacings 512, 514, and 516.

Figure 5C:
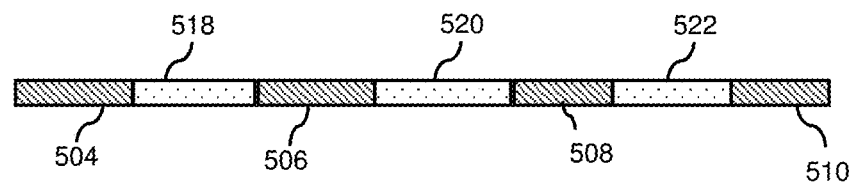

As shown in FIG. 5C, a filler material, such as polymethyl methacrylate (PMMA), is spin coated into spacings 512, 514 and 516 to as filler area 518, 520, and 522 to provide a flat surface to grow a dielectric layer and to form a mechanical support, as will be described below.

Returning to FIG. 4, after the nanograting is provided (S404), a dielectric layer is formed (S406). This will be described in greater detail with reference to FIG. 5D.

Figure 5D:
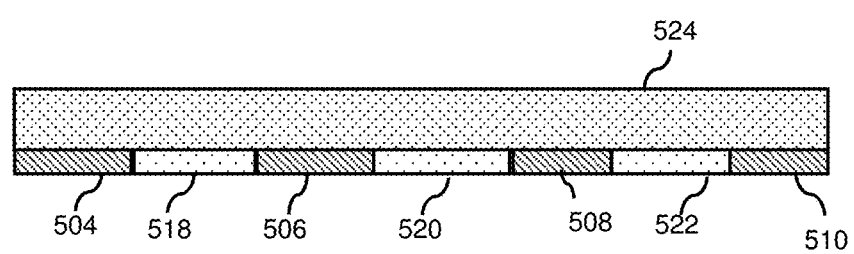

As shown in FIG. 5D, a dielectric layer 524 is deposited or thermally grown onto the graphene portions and filler portions. Dielectric layer 524 may deposited by known depositions methods, such as for example electron beam deposition or sputtering, and may be doped during this process by known doping methods.

Returning to FIG. 4, after a dielectric layer is formed (S406), the WS nanoparticles are deposited (S408). This will be described in greater detail with reference to FIG. 5E.

Figure 5E:
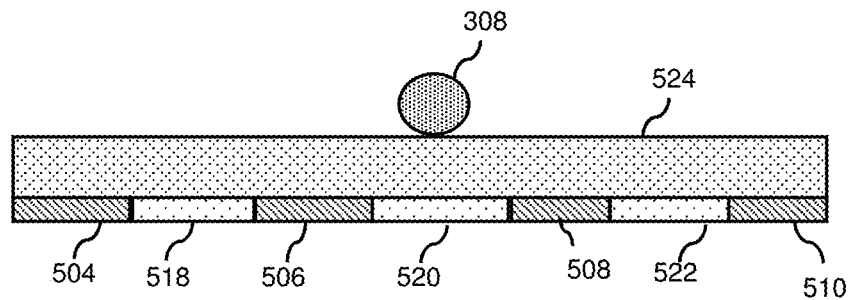

As shown in FIG. 5E, WSP 308 and WSP 310 (not shown) may be deposited on dielectric layer 524, by a micro-manipulator equipped with scanning electron microscopy.

The precise control of the position where WSP 308 and WSP 310 are deposited may be achieved by using a micro-manipulator equipped with scanning electron microscopy (SEM), wherein the micro-manipulator has a nanoscale tip that can move the nanoparticles.

Returning to FIG. 4, after the Weyl semimetal nanoparticles are deposited (S408), the remainder of the dielectric is formed (S410). This will be described in greater detail with reference to FIG. 5F.

Figure 5F:
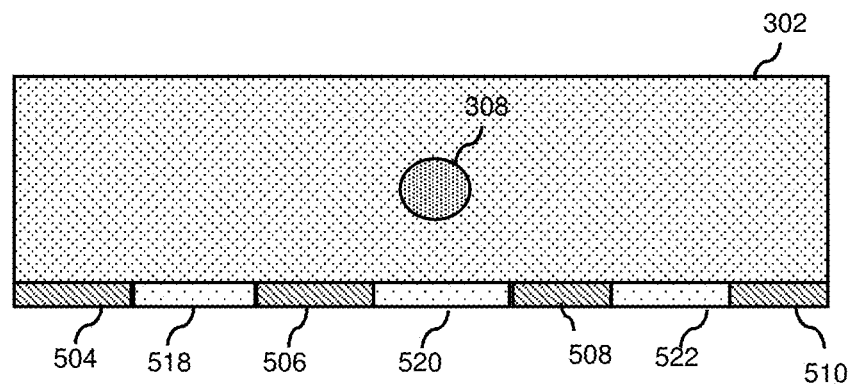

As shown in FIG. 5F, the same dielectric that was deposited prior, as discussed above with reference to FIG. 5D, is again deposited to embed WSP 308 and WSP 310 (not shown). By using the same dielectric, during this process, lattice mismatch is minimized to improve the structure of resulting dielectric enclosure 302.

Returning to FIG. 4, after the remainder of the dielectric is formed (S410), the voltage source is connected (S412). This will be described in greater detail with reference to FIGS. 5G-H.

Figure 5G:
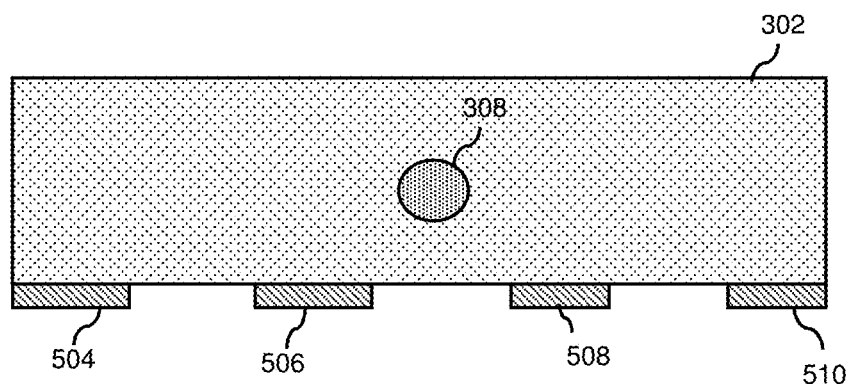

As shown in FIG. 5G, filler areas 518, 520, and 522 are removed via etching with acetone.

Figure 5H:
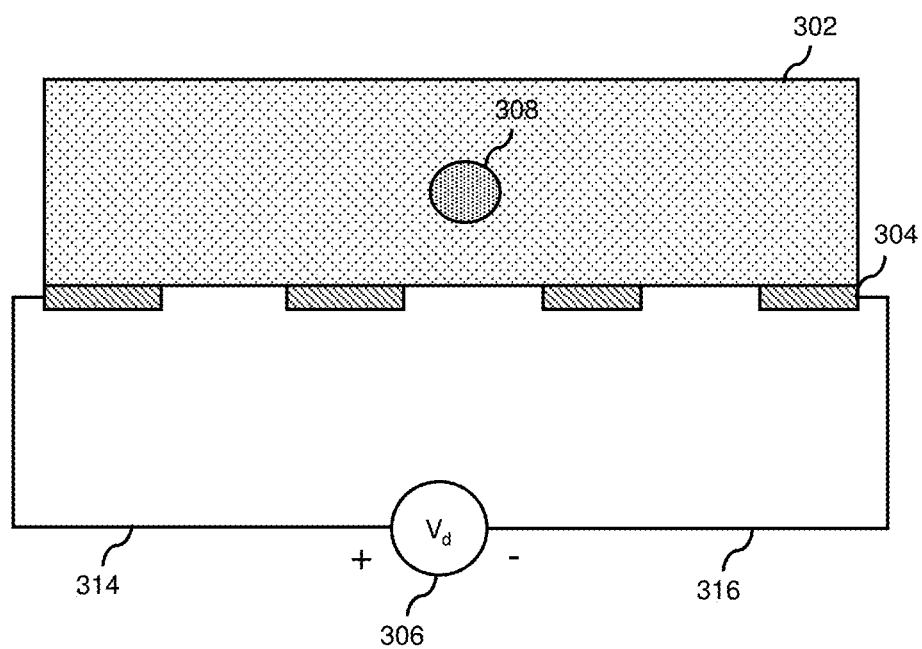

As shown in FIG. 5H, voltage source 306 is connected to nanograting 304 via conducting line 314 and conducting line 316.

Returning to FIG. 4, after the voltage source is connected (S412), method 400 stops (S414).

Now that a thermal diode in accordance with aspects of the present disclosure has been created, it may be operated.

Figure 6:
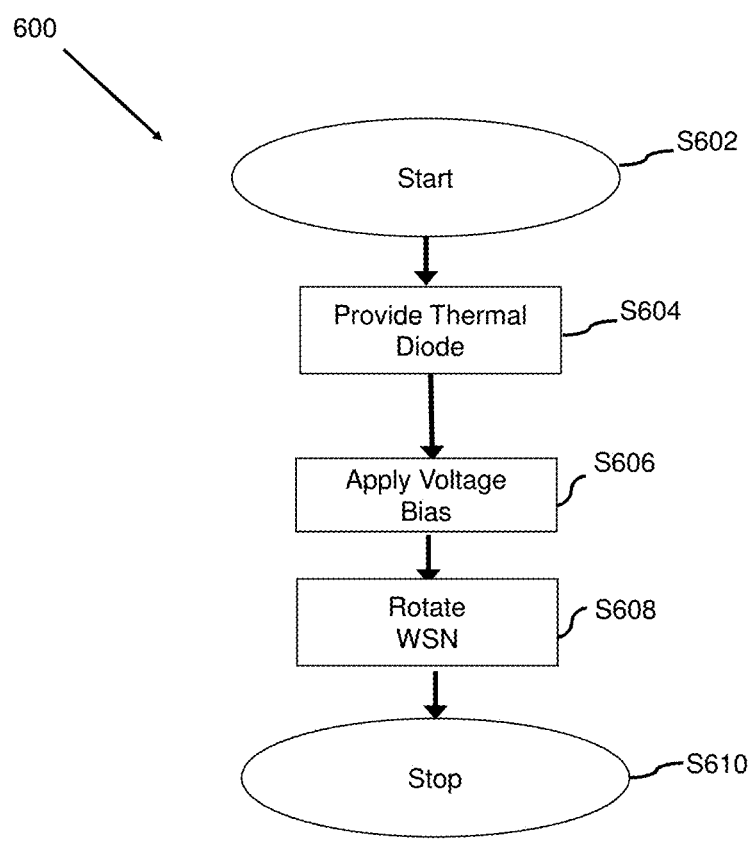
FIG. 6 illustrates a method of operating a thermal diode in accordance with aspects of the present disclosure.

FIG. 6 illustrates a method 600 of operating a thermal diode in accordance with aspects of the present disclosure.

As shown in the figure, method 600 starts (S602) and a thermal diode is provided (S604). For example, thermal diode system 300 may be provided as described above with reference to FIGS. 3-5H.

Returning to FIG. 6, after the thermal diode is provided (S604), a bias voltage is applied (S606). For example, as shown in FIG. 3, voltage source 306 may provide a voltage bias to nanograting 304 via conducting lines 314 and 316. In non-limiting example embodiments, the voltage bias is in a range from −20 V to 20 V.

Returning to FIG. 6, after a bias voltage is applied (S606), both WSNs are rotated (S608). For example, as shown in FIG. 3, magnetic field source 312 generates a magnetic field that rotates WSN 308 and WSN 310 by the same predetermined angle Θ. The angle Θ may be determined from a priori data developed from previous testing of thermal diode system 300. This will be described in greater detail with reference to FIGS. 7-10.

Figure 7:
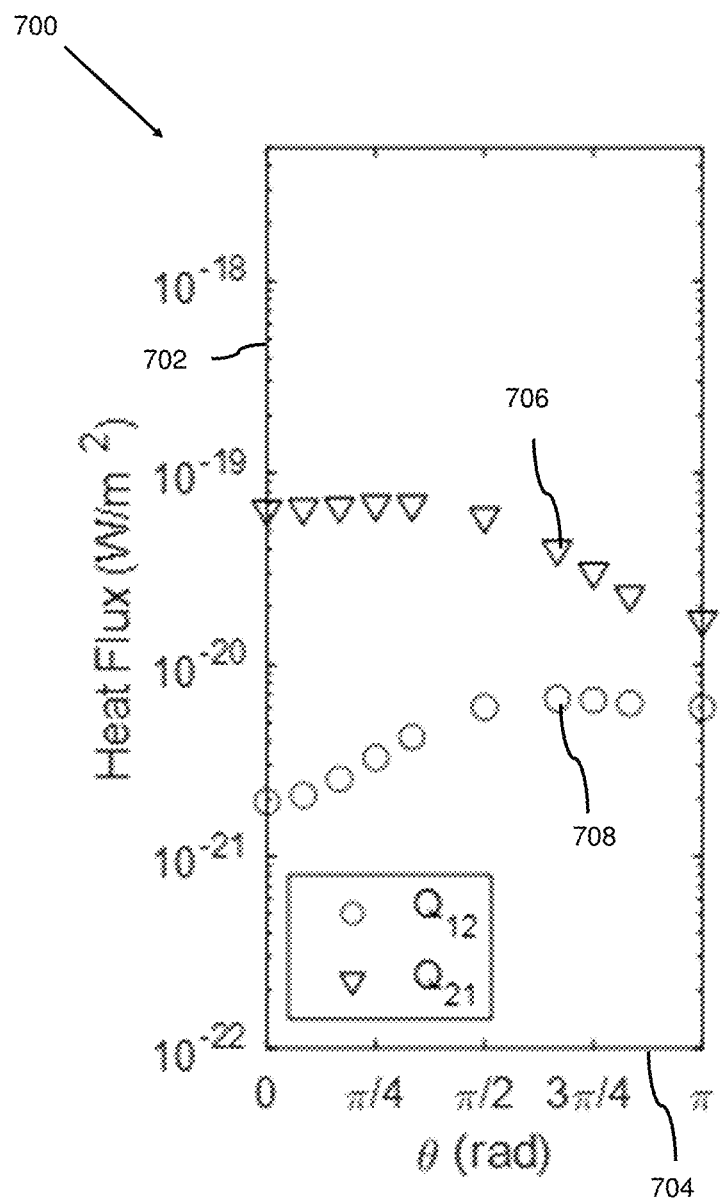
FIG. 7 illustrates a graph of heat flux as a function of rotation angle of a Weyl semimetal nanoparticle having one loss factor in two modes of operation in accordance with aspects of the present disclosure.

FIG. 7 illustrates a graph 700 of heat flux as a function of rotation angle of a Weyl semimetal nanoparticle in two modes of operation with a loss factor τ of 0.01 femto-seconds (fs) in accordance with aspects of the present disclosure. The loss factor τ of 0.01 fs has been experimentally verified in the literature for the WS materials, though practically other loss factors may be chosen by appropriately doping the WS nanoparticles.

As shown in the figure, graph 700 has a y-axis 702 of heat flux measured in units of W/m$^2$, an x-axis 704 of rotation angle Θ measured in radians, a plurality of data points 706, and a plurality of data points 708.

X-axis 704 corresponds to the angle Θ for which WSN 308 and WSN 310 are rotated. The plurality of data points 706 correspond to the heat flux in a direction from WSN 308 to WSN 310. The plurality of data points 708 correspond to the heat flux in a direction from WSN 310 to WSN 308.

It is clear from graph 700 that the heat flux in a direction from WSN 308 to WSN 310 associated with the plurality of data points 706 is on the order of 10-100 times larger than the heat flux in a direction from WSN 310 to WSN 308 associated with the plurality of data points 708. This holds true for 0≤Θ≤π.

Figure 8:
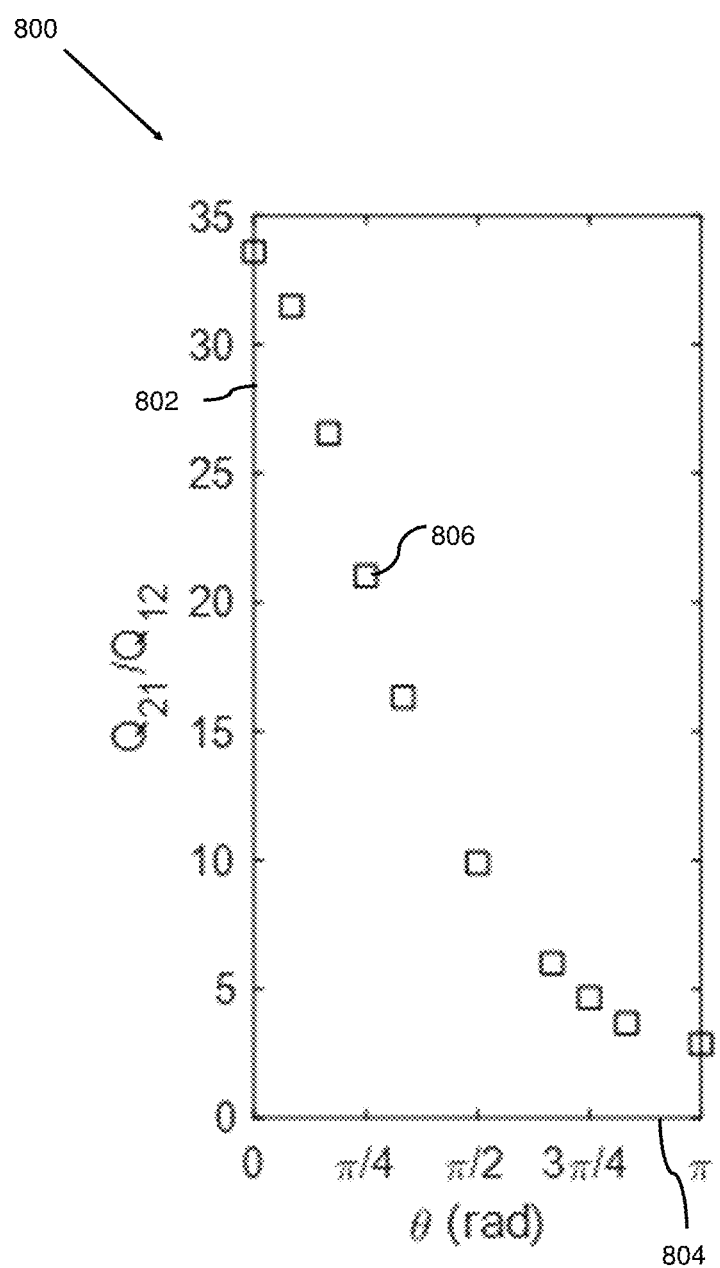
FIG. 8 illustrates a graph of a ratio of heat flux as a function of rotation angle of two Weyl semimetal nanoparticles having one loss factor.

FIG. 8 illustrates a graph 800 of a ratio of heat flux as a function of rotation angle of two WSNs in two modes of operation of FIG. 7.

As shown in the figure, graph 800 has a y-axis 802 of a ratio of heat flux, an x-axis 804 of rotation angle Θ measured in radians, and a plurality of data points 806.

The ratio of heat flux of y-axis 802 is a ratio of the heat flux in a direction from WSN 310 to WSN 308 over the heat flux in a direction from WSN 308 to WSN 310.

It should be noted that at Θ=0 radians, the heat flux in the direction from WSN 308 to WSN 310, $Q_{21}$, is on the order of about 34 times larger than the heat flux in the direction from WSN 310 to WSN 308, $Q_{12}$. It should be noted that 34 times larger is a much more pronounced thermal diode as compared with the 6-fold increase as discussed with the related art above with reference to FIG. 2.

Figure 9:
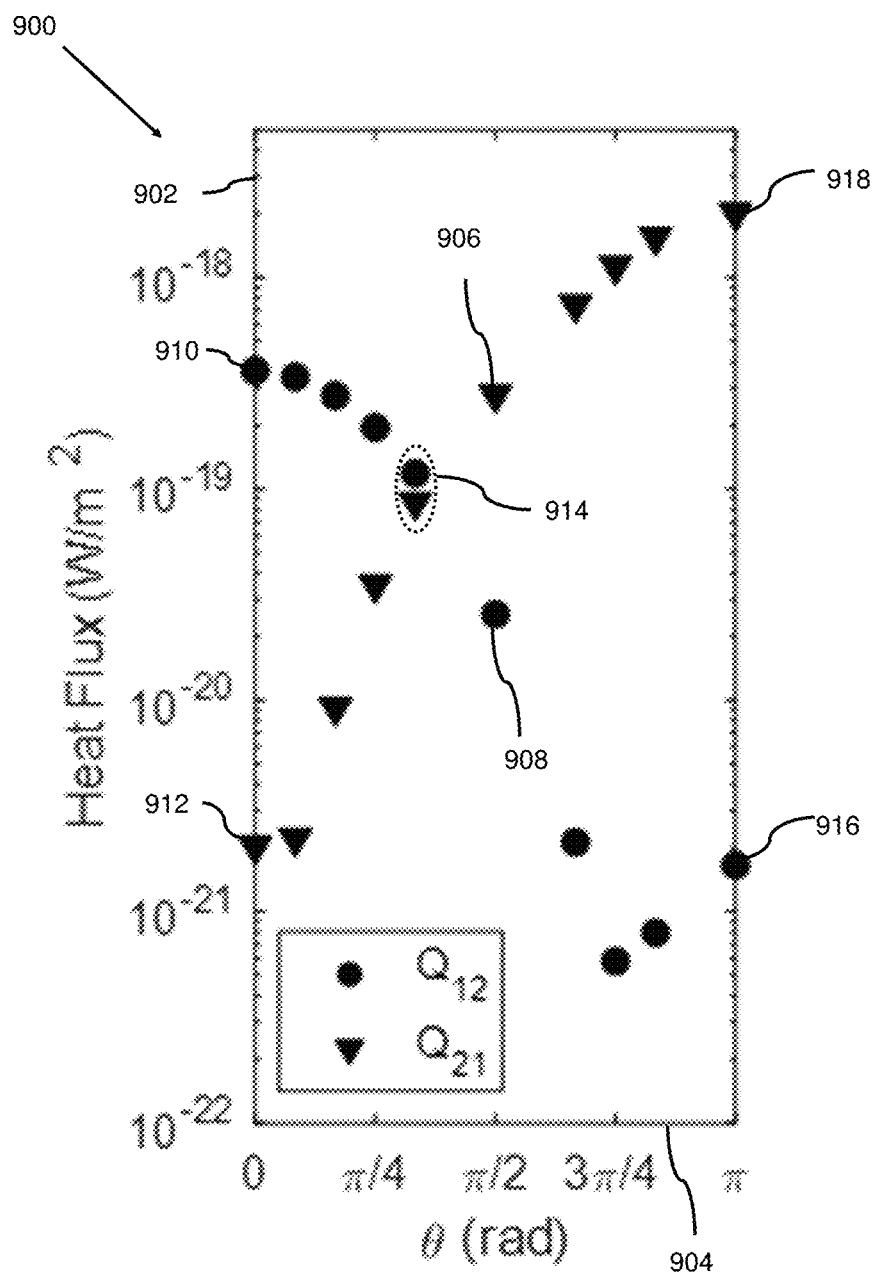
FIG. 9 illustrates another graph of heat flux as a function of rotation angle of two Weyl semimetal nanoparticles having another loss factor in two modes of operation in accordance with aspects of the present disclosure.

FIG. 9 illustrates another graph 900 of heat flux as a function of rotation angle of two WSNs in two modes of operation with a loss factor τ of 1.0 femto-seconds (fs) in accordance with aspects of the present disclosure.

As shown in the figure, graph 900 has a y-axis 902 of heat flux measured in units of W/m$^2$, an x-axis 904 of rotation angle Θ measured in radians, a plurality of data points 906, and a plurality of data points 908.

X-axis 905 corresponds to the angle Θ for which WSN 308 and WSN 310 are rotated. The plurality of data points 906 correspond to the heat flux in a direction from WSN 308 to WSN 310. The plurality of data points 908 correspond to the heat flux in a direction from WSN 310 to WSN 308.

It should be noted that as compared with graph 700 of FIG. 7, in this case, the total heat flux changes drastically over range of rotation angle Θ. In particular, at Θ=0 radians, the heat flux from WSN 308 to WSN 310, i.e., $Q_{12}$, as shown by dot 910 is on the order of 10$^2$ larger than the heat flux from WSN 310 to WSN 308, i.e., $Q_{21}$, as shown by triangle 912.

Further, at Θ≠π/3 radians, the heat flux from WSN 308 to WSN 310, i.e., $Q_{12}$, as shown by area 914 is roughly equal to the heat flux from WSN 310 to WSN 308, i.e., $Q_{21}$.

Finally, at Θ=π radians, the heat flux from WSN 308 to WSN 310, i.e., $Q_{12}$, as shown by dot 916 is on the order of 10$^3$ smaller than the heat flux from WSN 310 to WSN 308, i.e., $Q_{21}$, as shown by triangle 918. Therefore, in this embodiment, wherein the doping in WSNs is so much higher as to increase the loss factor from 0.1 fs, as discussed above with reference to FIGS. 7-8, to a loss factor of 1.0 fs, the heat flux response is able to transition from one direction to a second direction based on the rotation angle of the WSN 310.

Figure 10:
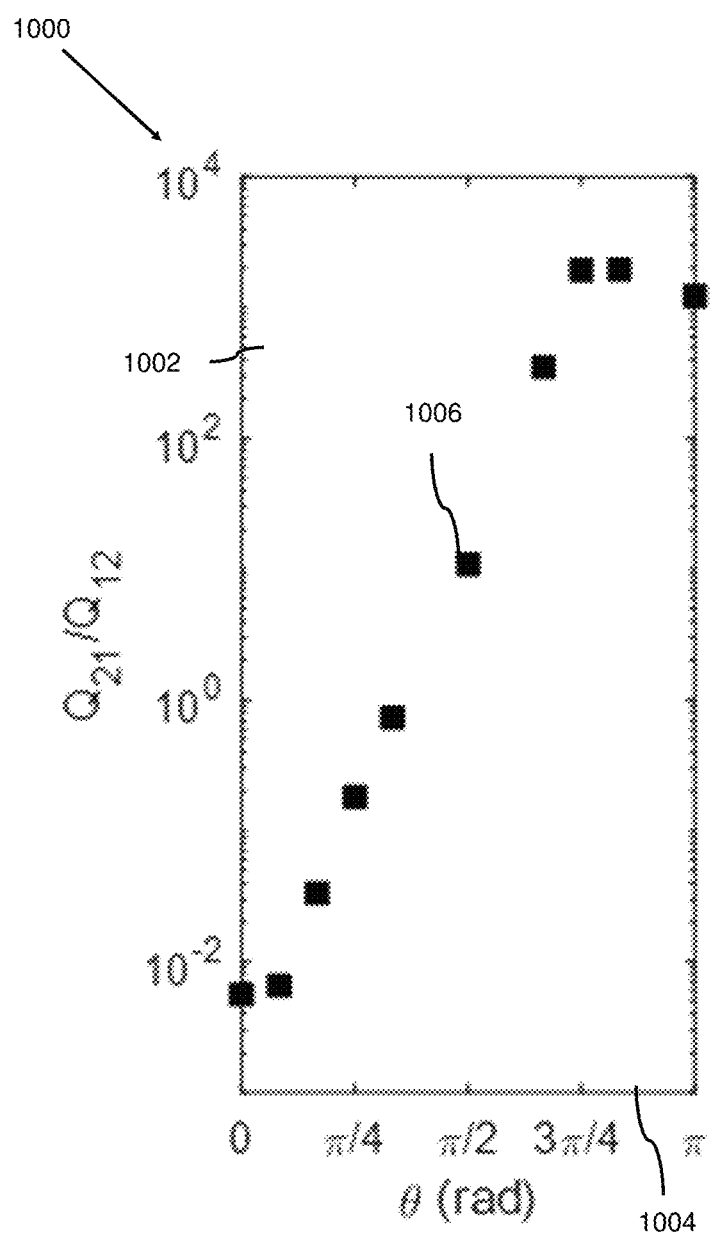
FIG. 10 illustrates a graph of a ratio of heat flux as a function of rotation angle of two Weyl semimetal nanoparticles having another loss factor in two modes of operation of FIG. 9.

FIG. 10 illustrates a graph 1000 of a ratio of heat flux as a function of rotation angle of two WSNs in two modes of operation of FIG. 9.

As shown in the figure, graph 1000 has a y-axis 1002 of a ratio of heat flux, an x-axis 1004 of rotation angle Θ measured in radians, and a plurality of data points 1006.

The ratio of heat flux of y-axis 1002 is a ratio of the heat flux in a direction from WSN 310 to WSN 308 over the heat flux in a direction from WSN 308 to WSN 310. As shown in the figure, the change in heat flux between $0 \leq \Theta \leq \pi$ is on the order of $10^5$ ($10^3$-$10^{-2}$).

Returning to FIG. 6, after the WSNs are rotated (S608), method 600 stops (S610).

In the above-discussed non-limiting embodiments, 306 provided a voltage bias to nanograting 304 to effect of the surface waves the of dielectric enclosure 302. With this in mind, in accordance with aspects of the present disclosure, the surface waves of the dielectric enclosure 302 may be further modified to tune the thermal diode system by modifying the voltage bias applied to nanograting 304. This will be described in greater detail with reference to FIGS. 11A-D.

FIGS. 11A-D illustrate another example thermal diode system 1100 in accordance with aspects of the present disclosure, being operated in four different modes, respectively.

Figure 11A:
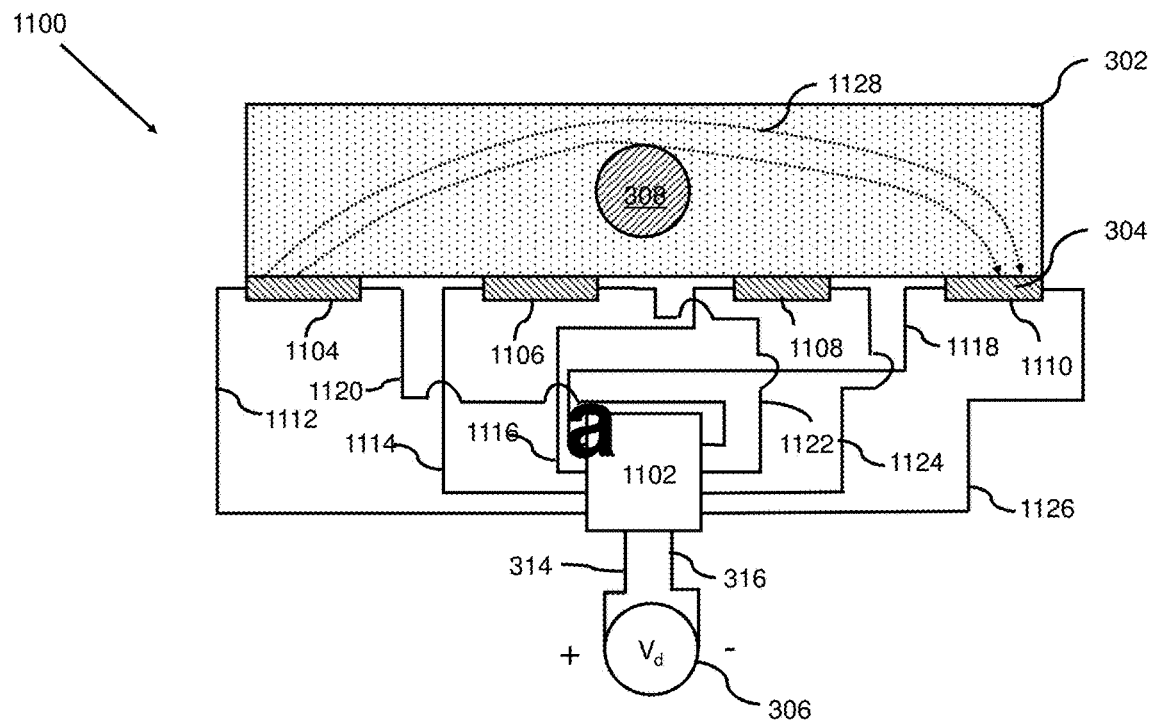
FIGS. 11A-D illustrate another example thermal diode in accordance with aspects of the present disclosure, being operated in four different modes, respectively.

As shown in FIG. 11A, thermal diode system 1100 includes dielectric enclosure 302, nanograting 304, voltage source 306, WSN 308 and a voltage controller 1102. Nanograting 304 includes graphene portions 1104, 1106, 1108, and 1110. Voltage controller 1102 is configured to provide a positive voltage from voltage source 306 to one of: graphene portion 1104 via a conducting line 1112; to graphene portion 1106 via a conducting line 1114; to graphene portion 1108 via a conducting line 1116, and to graphene portion 1110 via a conducting line 1118. Voltage controller 1102 is configured to additionally to return a negative voltage to voltage source 306 from one of: graphene portion 1104 via a conducting line 1120; graphene portion 1106 via a conducting line 1122; to graphene portion 1108 via a conducting line 1124, and to graphene portion 1110 via a conducting line 1126.

Voltage controller 1102 is configured to communicate with graphene portions 1104, 1106, 1108, and 1110 via conducting lines 1112, 1114, 1116, and 1118 respectively. Further, voltage controller 1102 is configured to communicate with 1104, 1106, 1108, and 1110 via conducting lines 1112, 1114, 1116, and 1118 respectively.

Voltage source 306 is configured to provide a positive voltage to graphene portion 1104 via conducting line 1112 and to receive a negative voltage from graphene portion 1110 via the conducting line 1126. By providing a voltage to each of graphene portions 1104 and 1110, an electric field is generated between graphene portion 1104 and graphene portion 1110 as indicted by dotted arrows 1128.

The electric field generated between graphene portion 1104 and graphene portion 1110 as indicted by dotted arrows 1128 will have a predetermined influence on both the heat flux from WSN 308 to WSN 310, i.e., $Q_{12}$, and the heat flux from WSN 310 to WSN 308, i.e., $Q_{21}$.

Figure 11B:
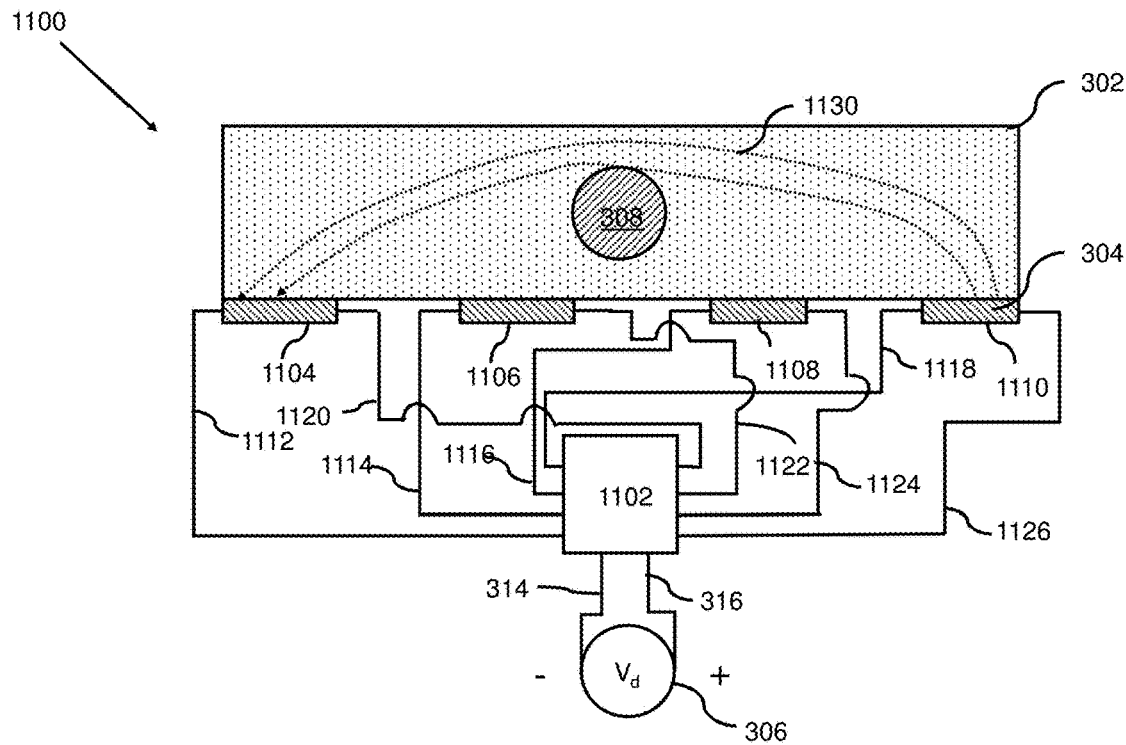

As shown in FIG. 11B, the thermal diode system 1100 is operated in a manner opposite to that as discussed above with reference to FIG. 11A.

In particular, in FIG. 11B, voltage source 306 is configured to provide a negative voltage to graphene portion 1104 via conducting line 1112 and to receive a positive voltage from graphene portion 1110 via the conducting line 1126. By providing a voltage to each of graphene portions 1104 and 1110, an electric field is generated between graphene portion 1104 and graphene portion 1110 as indicted by dotted arrows 1130.

The electric field generated between graphene portion 1104 and graphene portion 1110 as indicted by dotted arrows 1130 will have a predetermined influence on both the heat flux from WSN 308 to WSN 310, i.e., $Q_{12}$, and the heat flux from WSN 310 to WSN 308, i.e., $Q_{21}$, wherein the influence is different from that as discussed above with reference to FIG. 11A.

It should be noted that an electric field need not be generated from the outer bounds of nanograting 304. On the contrary, in accordance with aspects of the present disclosure, any combination of portions of nanograting 304 may be activated to affect the surface waves within dielectric enclosure 302. Some example embodiments of other portions of nanograting 304 being activated to affect the surface waves within dielectric enclosure 302 will now be described with reference to FIGS. 11C-D.

Figure 11C:
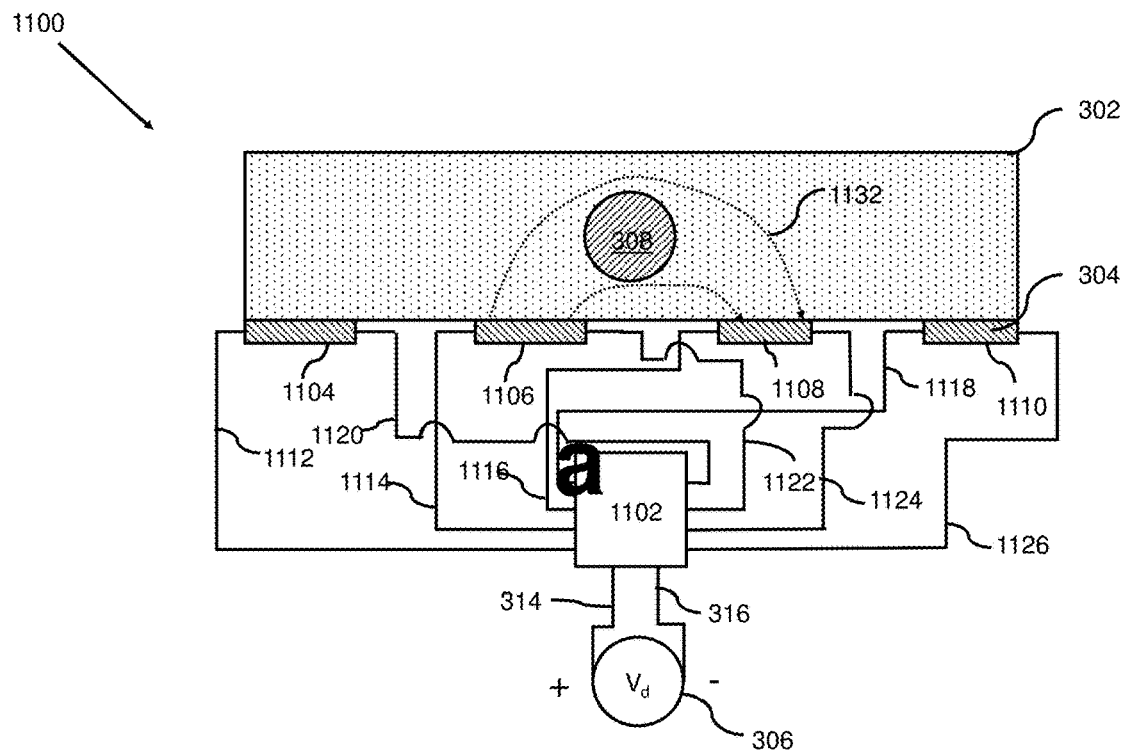

As shown in FIG. 11C, voltage controller 1102 is configured to provide a positive voltage from voltage source 306 to graphene portion 1106 via a conducting line 1114. Voltage controller 1102 is configured to additionally to return a negative voltage to voltage source 306 from graphene portion 1108 via a conducting line 1124. By providing a voltage to each of graphene portions 1106 and 1108, an electric field is generated between graphene portion 1106 and graphene portion 1108 as indicted by dotted arrows 1132.

The electric field generated between graphene portion 1106 and graphene portion 1108 as indicted by dotted arrows 1132 will have a predetermined influence on both the heat flux from WSN 308 to WSN 310, i.e., $Q_{12}$, and the heat flux from WSN 310 to WSN 308, i.e., $Q_{21}$. This influence may be different that that as discussed above with reference to FIG. 11A.

Figure 11D:
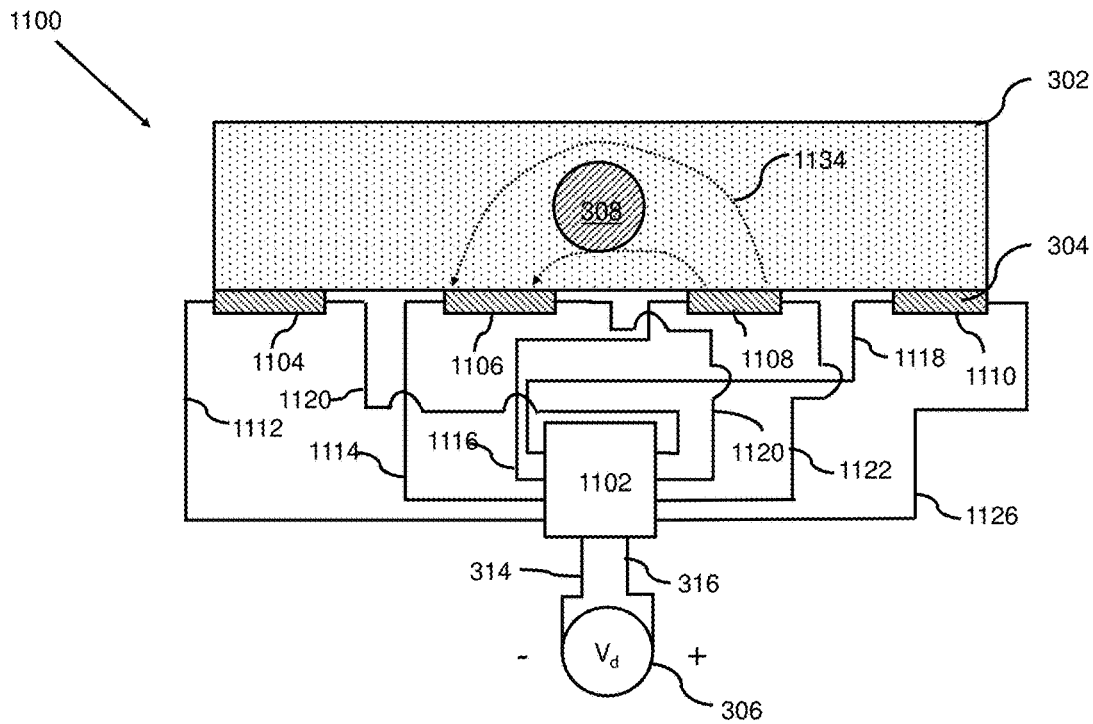

As shown in FIG. 11D, the thermal diode system 1100 is operated in a manner opposite to that as discussed above with reference to FIG. 11C.

In particular, in FIG. 11D, voltage source 306 is configured to provide a negative voltage to graphene portion 1106 via conducting line 1114 and to receive a positive voltage from graphene portion 1108 via the conducting line 1122. By providing a voltage to each of graphene portions 1106 and 1108, an electric field is generated between graphene portion 1106 and graphene portion 1108 as indicted by dotted arrows 1134.

The electric field generated between graphene portion 1106 and graphene portion 1108 as indicted by dotted arrows 1134 will have a predetermined influence on both the heat flux from WSN 308 to WSN 310, i.e., $Q_{12}$, and the heat flux from WSN 310 to WSN 308, i.e., $Q_{21}$, wherein the influence is different from that as discussed above with reference to FIG. 11C.

In light of the above discussion with respect to FIGS. 11A-D, it should be noted that any combination of any number if graphene portions may be excited to produce a thermal diode in accordance with aspects of the present disclosure.

In related thermal diodes, an extremely high magnetic field is required to achieve, a 6-fold difference in thermal transfer between two different WS particles. Further, the related thermal diodes are required to suspend the WS particles above a substrate in order to fulfill the difference in thermal transfer.

A benefit of a thermal diode system in accordance with aspects of the present example is that a large magnetic field is not required to achieve a large difference in thermal transfer. On the contrary, in accordance with aspects of the present disclosure, because the WS particles are suspended in a dielectric enclosure, there is no need for suspension of the WS particles. Further, a graphene nanograting in conjunction with a rotation of one of the WS particles increases the difference in thermal transfer between two WS particles.

The foregoing description of various preferred embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to enable others skilled in the art to best utilize the invention in various embodiments and with various modifications as are suited to the particular use contemplated. It is intended that the scope of the invention be defined by the claims appended hereto.

What is claimed is:

1. A thermal diode comprising:
   a dielectric enclosure having a top surface, a bottom surface, a first side, and a second side;
   a first Weyl semimetal nanoparticle disposed on the first side;
   a second Weyl semimetal nanoparticle disposed on the second side;
   a nanograting disposed on the bottom surface; and
   a voltage source configured to provide a voltage bias to the nanograting to suppress surface waves from said first Weyl semimetal nanoparticle to said second Weyl semimetal nanoparticle and to modify surface waves from said second Weyl semimetal nanoparticle to said first Weyl semimetal nanoparticle.

2. The thermal diode of claim 1, wherein said first Weyl semimetal nanoparticle and said second Weyl semimetal nanoparticle comprise a material selected from the group of materials consisting of $Co_3Sn_2S_2$, $Mn_3Sn$, $EuCd_2As_2$, TaAs, $MoTe_2$, NbAs, $YbMnBi_2$, and $WTe_2$.

3. The thermal diode of claim 1, wherein said dielectric enclosure comprises $SiO_2$.

4. The thermal diode of claim 1, wherein the distance between said nanograting and said first Weyl semimetal nanoparticle is 80 nm.

5. The thermal diode of claim 1, wherein said nanograting comprises graphene.

6. A method of making a thermal diode, said method comprising:
   providing a nanograting;
   forming a first portion of a dielectric on top of the provided nanograting;
   depositing a first Weyl semimetal nanoparticle at a first location on top of the first portion of the dielectric;
   depositing a second Weyl semimetal nanoparticle at a second location on top of the first portion of the dielectric;
   forming a second portion of the dielectric on top of the first portion of the dielectric, the first Weyl semimetal nanoparticle, and the second Weyl semimetal nanoparticle; and
   connecting a voltage source to the nanograting,
   wherein the voltage source is configured to provide a voltage bias to the nanograting to suppress surface waves from the first Weyl semimetal nanoparticle to the second Weyl semimetal nanoparticle and to modify surface waves from the second Weyl semimetal nanoparticle to the first Weyl semimetal nanoparticle.

7. The method of claim 6, wherein said depositing the first Weyl semimetal nanoparticle at the first location on top of the first portion of the dielectric first comprises depositing the first Weyl semimetal nanoparticle comprising a material selected from the group of materials consisting of $Co_3Sn_2S_2$, $Mn_3Sn$, $EuCd_2As_2$, TaAs, $MoTe_2$, NbAs, $YbMnBi_2$, and $WTe_2$.

8. The method of claim 6, wherein said forming the first portion of the dielectric on top of the provided nanograting comprises forming the first portion of the dielectric comprising $SiO_2$.

9. The method of claim 6, wherein said depositing the second Weyl semimetal nanoparticle at the second location on top of the first portion of the dielectric comprises depositing the second Weyl semimetal nanoparticle at from the first Weyl semimetal nanoparticle of 80 nm.

10. The method of claim 6, wherein said providing the nanograting comprises providing a graphene nanograting.

11. A method comprising:
    providing a thermal diode comprising:
        a dielectric enclosure having a top surface, a bottom surface, a first side, and a second side;
        a first Weyl semimetal nanoparticle disposed on the first side;
        a second Weyl semimetal nanoparticle disposed on the second side;
        a nanograting disposed on the bottom surface; and
        a voltage source configured to provide a voltage bias to the nanograting to suppress surface waves from the first Weyl semimetal nanoparticle to the second Weyl semimetal nanoparticle and to modify surface waves from the second Weyl semimetal nanoparticle to the first Weyl semimetal nanoparticle;
    applying the voltage bias to the nanograting; and
    rotating the first Weyl semimetal nanoparticle and the second Weyl semimetal nanoparticle about an axis by an angle $\Theta$,
    wherein $0° \leq \Theta \leq 360°$.

12. The method of claim 11, wherein said providing the thermal diode comprises providing the thermal diode such that the first Weyl semimetal nanoparticle and the second Weyl semimetal nanoparticle comprise a material selected from the group of materials consisting of $Co_3Sn_2S_2$, $Mn_3Sn$, $EuCd_2As_2$, TaAs, $MoTe_2$, NbAs, $YbMnBi_2$, and $WTe_2$.

13. The method of claim 11, wherein said providing the thermal diode comprises providing the thermal diode such that the dielectric enclosure comprises $SiO_2$.

14. The method of claim 11, wherein said providing the thermal diode comprises providing the thermal diode such that the distance between the nanograting and the first Weyl semimetal nanoparticle is 80 nm.

15. The method of claim 11, wherein said providing the thermal diode comprises providing the thermal diode such that the nanograting comprises graphene.

16. The method of claim 11, further comprising:
    applying, via the voltage source, a second voltage bias to the nanograting; and
    rotating the second Weyl semimetal nanoparticle about the axis by a second angle $\Theta_2$,
    wherein the voltage source is additionally configured to provide the second voltage bias to the nanograting to suppress surface waves from the second Weyl semimetal nanoparticle to the first Weyl semimetal nanoparticle and to modify surface waves from the first Weyl semimetal nanoparticle to the second Weyl semimetal nanoparticle,
    wherein a first net heat flux is different from a second net heat flux,
    wherein the first net heat flux corresponds to a difference between a first heat flux from the first Weyl semimetal nanoparticle to the second Weyl semimetal nanoparticle and a second heat flux from the second Weyl semimetal nanoparticle to the first Weyl semimetal nanoparticle when both Weyl semimetal nanoparticles are rotated about the axis by the angle $\Theta$, wherein the second net heat flux corresponds to a difference between a third heat flux from the first Weyl semimetal nanoparticle to the second Weyl semimetal nanoparticle and a fourth heat flux from the second Weyl semimetal nanoparticle to the first Weyl semimetal nanoparticle when both Weyl semimetal nanoparticles are rotated about the axis by the angle $\Theta_2$, wherein $0° \leq \Theta_2 \leq 360°$, and wherein $\Theta \neq \Theta_2$.

17. The method of claim 11, wherein said rotating the first Weyl semimetal nanoparticle and the second Weyl semimetal nanoparticle about an axis by an angle $\Theta$, comprises applying a magnetic field to both Weyl semimetal nanoparticles.

18. The method of claim 17, wherein said applying the magnetic field to both Weyl semimetal nanoparticles comprises applying the magnetic field to both Weyl semimetal nanoparticles for a predetermined time period.

19. The method of claim 18, wherein said applying the magnetic field to both Weyl semimetal nanoparticles comprises applying the magnetic field at a predetermined field strength to both Weyl semimetal nanoparticles.

20. The method of claim 17, wherein said applying the magnetic field to both Weyl semimetal nanoparticles comprises applying the magnetic field at a predetermined field strength to both Weyl semimetal nanoparticles.

* * * * *